United States Patent
Sohn et al.

(10) Patent No.: US 12,032,851 B2
(45) Date of Patent: Jul. 9, 2024

(54) STORAGE DEVICE AND OPERATING METHOD OF THE STORAGE DEVICE

(71) Applicant: SK hynix Inc., Icheon-si (KR)

(72) Inventors: Hyeok Chan Sohn, Icheon-si (KR); Kang Wook Jo, Icheon-si (KR); Hyeon Cheon Seol, Icheon-si (KR); Byung Ryul Kim, Icheon-si (KR); Jae Young Lee, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 58 days.

(21) Appl. No.: 17/867,050

(22) Filed: Jul. 18, 2022

(65) Prior Publication Data
US 2023/0030668 A1 Feb. 2, 2023

(30) Foreign Application Priority Data
Jul. 28, 2021 (KR) .................. 10-2021-0099126
May 27, 2022 (KR) .................. 10-2022-0065679

(51) Int. Cl.
*G06F 3/06* (2006.01)

(52) U.S. Cl.
CPC .......... *G06F 3/0655* (2013.01); *G06F 3/0608* (2013.01); *G06F 3/0679* (2013.01)

(58) Field of Classification Search
CPC .... G06F 3/0655; G06F 3/0608; G06F 3/0679; G06F 3/0613; G06F 3/0661; H03M 7/3066; H03M 7/6058
USPC .................................................. 711/154, 100
See application file for complete search history.

(56) References Cited

U.S. PATENT DOCUMENTS

| | | | |
|---|---|---|---|
| 2017/0123662 A1* | 5/2017 | Sharon | G06F 3/0661 |
| 2017/0255402 A1 | 9/2017 | Narasimha et al. | |
| 2022/0159207 A1* | 5/2022 | Del'Anna | H04N 19/42 |
| 2022/0269601 A1 | 8/2022 | Monteith | |
| 2022/0342554 A1 | 10/2022 | Chen et al. | |
| 2023/0031951 A1 | 2/2023 | Sohn | |
| 2023/0132037 A1 | 4/2023 | Mizushima et al. | |
| 2023/0195311 A1 | 6/2023 | Cooper et al. | |

FOREIGN PATENT DOCUMENTS

| | | |
|---|---|---|
| KR | 1020080022628 A | 3/2008 |
| KR | 1020080046345 A | 5/2008 |
| KR | 1020120098094 A | 9/2012 |
| KR | 1020210092302 A | 7/2021 |

* cited by examiner

*Primary Examiner* — David Yi
*Assistant Examiner* — Zubair Ahmed
(74) *Attorney, Agent, or Firm* — WILLIAM PARK & ASSOCIATES LTD.

(57) ABSTRACT

A storage device may include: a memory device for extracting bits having a first logic value among bits included in data received from outside the memory device, generating a plurality of compressed data chunks including the bits comprising the first logic value and position information representing positions of the bits having the first logic value in the data, and outputting the plurality of compressed data chunks in response to a data output command; and a memory controller for receiving the plurality of compressed data chunks from the memory device, and recovering the data, based on the bits having the first logic value, which are included in the plurality of compressed data, and the position information.

17 Claims, 10 Drawing Sheets

STORAGE DEVICE AND OPERATING METHOD OF THE STORAGE DEVICE

CROSS-REFERENCE TO RELATED APPLICATION

The present application claims priority under 35 U.S.C. § 119(a) to Korean patent application number 10-2021-0099126, filed on Jul. 28, 2021 and Korean patent application number 10-2022-0065679, filed on May 27, 2022, in the Korean Intellectual Property Office, the entire disclosure of which is incorporated herein by reference.

BACKGROUND

1. Technical Field

The present disclosure generally relates to an electronic device, and more particularly, to a storage device and an operating method of the storage device.

2. Related Art

A memory system is a device which stores data under the control of a host device such as a computer or a smart phone. A storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

Data read from the memory device may be moved through an input/output channel. When an amount of read data is greater than an amount of the data moved through the input/output channel, a bottleneck phenomenon may occur. In order to solve the bottleneck phenomenon, it is necessary to increase a number of input/output channels or to decrease an amount of data by compressing read data.

SUMMARY

In accordance with an embodiment of the present disclosure, there is provided a storage device including: a memory device configured to extract bits having a first logic value among bits included in data received from outside the memory device, generate a plurality of compressed data chunks including the bits comprising the first logic value and position information representing positions of the bits having the first logic value in the data, and output the plurality of compressed data chunks in response to a data output command; and a memory controller configured to receive the plurality of compressed data chunks from the memory device, and recover the data, based on the bits having the first logic value, which are included in the plurality of compressed data, and the position information.

In accordance with still another embodiment of the present disclosure, there is provided a method of operating a storage device, the method including: receiving a plurality of data chunks from a plurality of memory areas which transmit/receive data through one channel; dividing each of the plurality of data chunks into a plurality of partial data chunks; extracting bits having a first logic value among bits included in each of the plurality of partial data chunks, and generating a plurality of compressed data chunks including the bits having the first logic value and position information representing positions of the bits having the first logic value in the partial data; outputting the plurality of compressed data chunks in response to the data output command; and recovering the plurality of data chunks, based on an order in which the plurality of compressed data chunks are output, the bits having the first logic value, which are included in the plurality of compressed data chunks, and the position information.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a storage device and an operating method of the storage device, which can decrease an amount of input/output data by generating compressed data representing a value and a position of specific bits among bits included in read data.

In accordance with another embodiment of the present disclosure, there is provided a memory device including: a data receiver configured to read a plurality of read data from a plurality of memory areas which transmit/receive data through one channel; a data compressor configured to generate a plurality of compressed data from each of the plurality of read data, and a data output unit configured to simultaneously output the plurality of compressed data through the channel in response to a data output command.

In accordance with still another embodiment of the present disclosure, there is provided an encoding device configured to extract bits having a first logic value among bits included in data received from the outside, and generate a plurality of compressed data including the bits having the first logic value and first position information representing positions of the bits having the first logic value in the data.

Figure 1:
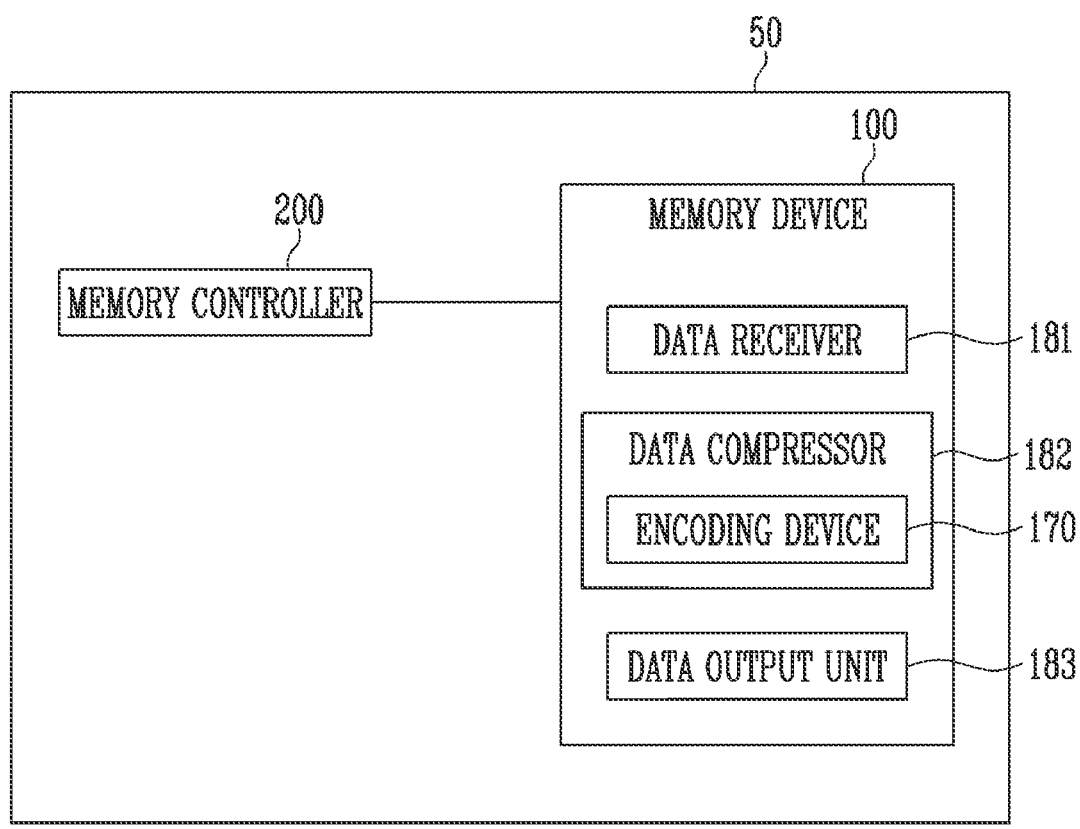
FIG. 1 is a diagram illustrating a storage device including a memory device in accordance with an embodiment of the present disclosure.

FIG. 1 is a diagram illustrating a storage device including a memory device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment system.

The memory device 100 may store data. The memory device 100 may operate under the control of the memory controller 200. The memory device 100 may include a memory cell array (not shown) including a plurality of memory cells for storing data.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

The memory device 100 may receive a command and an address from the memory controller 200, and access an area selected by the address in the memory cell array. The memory device 100 may perform an operation indicated by the command on the area selected by the address. For example, the memory device 100 may perform a write operation (program operation), a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50. The memory controller 200 may receive write data and a Logical Block Address (LBA) from the host, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other. Alternatively, the interleaving scheme may be a scheme in which at least two memory devices 100 operate in parallel to each other.

In an embodiment of the present disclosure, the storage device 50 may include a memory device 100 for outputting a plurality of compressed data obtained by compressing read data and a memory controller 200 for recovering the read data, based on the plurality of compressed data.

The memory device 100 may extract bits having a first logic value among bits included in read data read from selected memory cells. The memory device 100 may generate a plurality of compressed data including position information representing positions of the bits having the first logic value in the read data. The memory device 100 may output the plurality of compressed data in response to a data output command.

The memory controller 200 may receive the plurality of compressed data from the memory device 100. The memory controller 200 may recover the read data, based on the bits having the first logic value and the position information, which are included in the plurality of compressed data.

The memory device 100 may divide the read data into a plurality of partial data. The memory device 100 may generate a plurality of compressed data in each of the plurality of partial data. The memory device 100 may output the plurality of compressed data generated in each of the plurality of partial data according to an order in which the plurality of partial data are located in the read data.

The memory device 100 may determine a size of each of the plurality of partial data, based on a size of the plurality of compressed data. Each of the plurality of compressed data may include bits representing the position information and bits representing the first logic value.

The memory device 100 may determine a number of a plurality of compressed data allocated to each of a plurality of partial data, based on a predetermined compression ratio, and generate compressed data corresponding to the number. For example, when the compression ratio is 1:4, the memory device 100 may generate four compressed data with respect to one partial data. Even when a position of additional bits having the first logic value exists in partial data, the memory device 100 may generate only compressed data corresponding to the determined number. The word "predetermined" as used herein with respect to a parameter, such as a predetermined compression ratio, predetermined position, and predetermined mapping order etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The memory controller 200 may determine an order of a plurality of partial data recovered by the plurality of compressed data, based on an order in which the plurality of compressed data are output. The memory controller 200 may recover the read data according to the determined order. That is, the order in which the compressed data are output may become information representing a position of the partial data.

The memory controller 200 may recover the plurality of partial data including the bits having the first logic value as a position determined based on the position information included in the compressed data. The memory controller 200 may determine an order of the plurality of partial data from the order in which the plurality of compressed data are received, and recover the read data before being compressed by connecting the recovered partial data based on the determined order.

In an embodiment of the present disclosure, the memory device 100 may include a plurality of memory areas. The memory area may be a unit capable of independently performing an operation. For example, the memory device 100 may include 2, 4 or 8 memory areas. The plurality of memory areas may independently perform a program operation, a read operation, or an erase operation at the same time. In an embodiment of the present disclosure, the memory area may be referred to as a plane.

The memory device 100 may include a data receiver 181 for receiving a plurality of data from a plurality of memory areas which transmit/receive data through one channel, a data compressor 182 for generating a plurality of compressed data from each of the plurality of read data, and a data output unit 183 for simultaneously outputting the plurality of compressed data through the channel in response to a data output command. The data receiver 181 may receive a plurality of data from outside. In an embodiment, the data received from the outside may be received from outside the memory controller 200, the encoding device 170, the data compressor 182, the memory device 100, or the storage device 50. The data receiver 181 may perform a read operation of reading a plurality of read data from the plurality of memory areas.

The data output unit 183 may simultaneously receive a plurality of compressed data through data lines. The data output unit 183 may output the plurality of compressed data according to a mapping order associated with the plurality of memory areas in one output cycle.

The data compressor 182 may perform a sampling operation of extracting bits having the first logic value among bits included in each of the plurality of read data. The data compressor 182 may generate a plurality of compressed data including the bits having the first logic value and position information representing positions of the bits having the first logic value in each of the plurality of read data.

The data compressor 182 may divide the plurality of read data into a plurality of partial data. The data compressor 182 may generate a plurality of compressed data in each of the plurality of partial data. The data compressor 182 may transmit the plurality of partial data to the data output unit 183 according to an order in which the plurality of partial data are located in each of the plurality of read data.

The data compressor 182 may determine a size of each of the plurality of partial data as a number of bits, the number of bits being calculated by the formula $M*(2^N)$ to provide the plurality of partial data as $M*(2^N)$ bits. Each of the plurality of compressed data may include N bits representing the position information and M bits representing the first logic value. In an embodiment, N may be a natural number. In an embodiment, M may be a natural number.

The data compressor 182 may determine a number of a plurality of compressed data generated from the plurality of partial data, based on a predetermined compression ratio. The data compressor 182 may generate compressed data corresponding to the determined number.

In an embodiment of the present disclosure, the data receiver 181 may determine a number of a plurality of memory areas read based on the predetermined compression ratio. A total amount of compressed data output through the channel may be equal to a total amount of data which can be output through the channel.

In another embodiment of the present disclosure, the data compressor 182 may determine the data compression ratio, based on the number of the plurality of memory areas from which the data receiver 181 reads the read data. For example, when the number of the memory areas is 4, the data compressor 182 may determine the compression ratio as 1:4. The data compressor 182 may compress a size of one read data to ¼, based on the compression ratio of 1:4, and generate four compressed data. The data output unit 183 may output the four generated compressed data during one output cycle according to a predetermined mapping order.

In an embodiment of the present disclosure, the data compressor 182 may include an encoding device 170 for compressing read data. The encoding device 170 may extract bits having the first logic value among bits included in read data received from the outside. The encoding device 170 may generate a plurality of compressed data including the bits having the first logic value and first position information representing positions of the bits having the first logic value in the read data. In an embodiment, the read data received from the outside may be read data received from outside the memory controller 200, the encoding device 170, the data compressor 182, the memory device 100, or the storage device 50.

The encoding device 170 may divide the read data into a plurality of partial data. The encoding device 170 may perform sampling by using, as a unit, two or more bits in each of the plurality of partial data. The encoding device 170 may detect bit groups including the bits having the first logic value. The encoding device 170 may determine a bit unit for sampling partial data according to a number of bits having the first logic value. For example, when the number of the bits having the first logic value is greater than a number of compressed data which the encoding device 170 can generate, the bit unit for sampling may be increased. A number of the bits included in the bit groups may be increased corresponding to the increase in the bit unit. A number of bits representing position information included in compressed data may be decreased corresponding to the increase in the number of bits.

The encoding device 170 may generate second position information representing a position of bit groups in each of the plurality of partial data and a plurality of compressed data including sampling data of the bit groups. The encoding device 170 may determine a size of each of the plurality of partial data as $M*(2^N)$ bits. The second position information may be expressed with N bits, and the sampling data may be expressed with M bits. In an embodiment, N may be a natural number. In an embodiment, M may be a natural number.

In an embodiment of the present disclosure, the encoding device 170 may receive a plurality of read data from a plurality of memory areas. The encoding device 170 may determine a compression ratio, based on a number of the plurality of memory areas. The encoding device 170 may generate a plurality of compressed data from each of the plurality of read data, based on the determined compression ratio.

Figure 2:
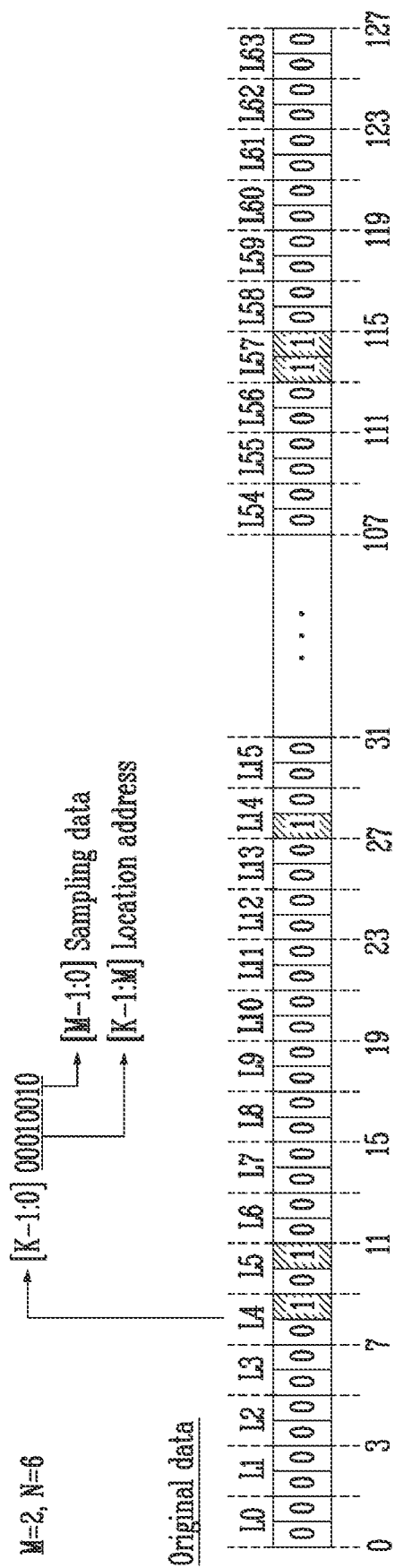
FIG. 2 is a diagram illustrating a method of generating compressed data in accordance with an embodiment of the present disclosure.

FIG. 2 is a diagram illustrating a method of generating compressed data in accordance with an embodiment of the present disclosure.

Referring to FIG. 2, original data may be encoded, so that compressed data are generated. For convenience of description, the original data may have 128 bits, and one compressed data has a size equaling a number of bits, for example, a size of 8 bits.

The original data may be sampled in a unit of two bits. Higher 6 bits among the 8 bits of the compressed data may be position information representing positions of bits having a first logic value. Lower 2 bits of the compressed data may be information representing sampling data of the bits having the first logic value.

In an embodiment of the present disclosure, the first logic value may be 1. In FIG. 2, a ninth bit, an eleventh bit, a twenty-eighth bit, a one hundred and fourteenth bit, and a one hundred and fifteenth bit have the first logic value. Since the original data is sampled in the unit of two bits, a fourth bit group L4, a fifth bit group L5, a fourteenth bit group L14, and a fifty-seventh bit group L57 may be extracted. The encoding device 170 may generate compressed data, based on the fourth bit group L4, the fifth bit group L5, the fourteenth bit group L14, and the fifty-seventh bit group L57.

For example, a position of the fourth bit group L4 in the original data may be represented as 000100, and sampling data of the fourth bit group L4 may be represented as 10. That is, the compressed data representing the fourth bit group L4 may be a binary number of 00010010. Similarly, the fifth bit group L5, the fourteenth bit group L14, and the fifty-seventh bit group L57 may also be encoded, to be expressed as binary numbers.

The original data shown in FIG. 2 may be partial data obtained by dividing read data. A size of the partial data may be M*(2^N) bits. Position information may be expressed with N bits, and sampling data may be expressed with M bits. In FIG. 2, a case where an address information bit number N is 6, a bit number M of sampling data is 2, and a bit number K of compressed data is 8 is illustrated as an embodiment. However, this is merely an embodiment, and the size of the partial data, the size of the position information, and the size of the sampling data may vary.

Figure 3:
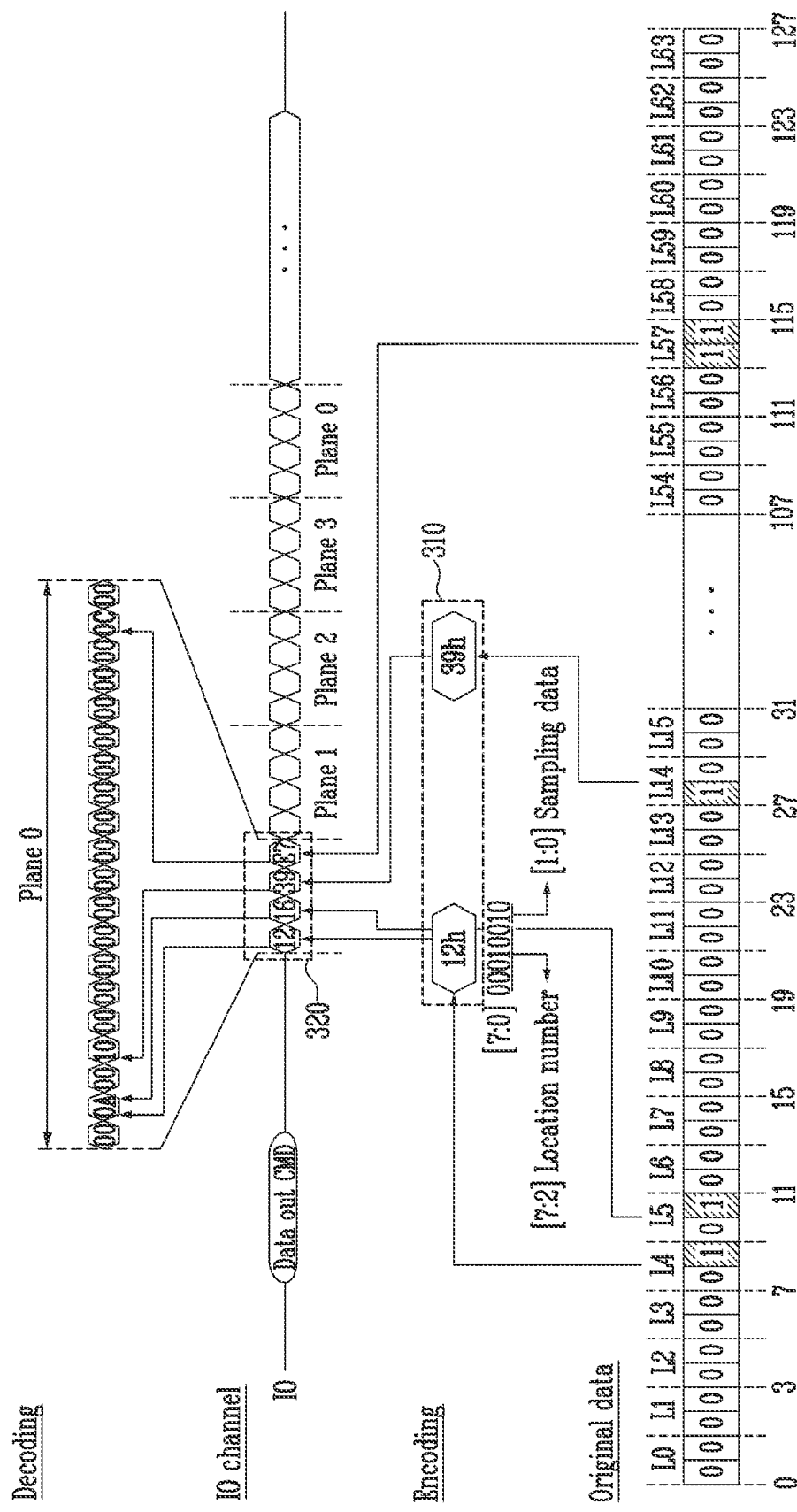
FIG. 3 is a diagram illustrating an operating method of the storage device in accordance with an embodiment of the present disclosure.

FIG. 3 is a diagram illustrating an operating method of the storage device in accordance with an embodiment of the present disclosure.

Referring to FIG. 3, original data may be encoded so that a plurality of compressed data may be generated. The compressed data 310 may be output through an input/output channel IO. The memory controller may receive the plurality of compressed data 310, and recover the original data, based on the plurality of compressed data 310.

The original data may be read data that is read from memory cells. In an embodiment of the present disclosure, the memory device may read a plurality of read data from a plurality of memory areas. The original data may be one of a plurality of partial data obtained by dividing the read data. In FIG. 3, the original data may be one of partial data obtained by dividing read data read from a zeroth memory area.

Bits having a first logic value among bits included in the partial data may be detected, and a plurality of compressed data may be generated. In an embodiment of the present disclosure, the compressed data may be expressed with a binary number or be expressed with a hexadecimal number. In this specification, data is not changed according to expression manners of the data, and the expression manners of the data may be combined for convenience of expression. For example, when compressed data is expressed with a binary number, the compressed data may be 00010010. When compressed data is expressed with a hexadecimal number, the compressed data may be 12. Here, h after a number may be a symbol representing the hexadecimal number.

The generated compressed data 310 may be output through the input/output channel 10 in response to an output command (Data out CMD). An order of output data is predetermined in the input/output channel 10. For example, the generated compressed data 310 may be included in Plane 0. The input/output channel 10 may output data 320 included in the Plane 0 and then output data included in Plane 1. Data included in Plane 2 and Plane 3 may also output sequentially. Compressed data generated from the same memory area may be continuously output. In another embodiment of the present disclosure, compressed data generated from different memory areas may be output during one output cycle. The data 320 may include the generated compressed data 310.

The memory controller may determine an order of a plurality of partial data recovered by the plurality of compressed data, based on the order in which the plurality of compressed data are output. The memory controller may recover the read data according to the determined order. The order in which the plurality of compressed data are output may represent memory areas in which the compressed data are generated and an approximate position in the original data.

The memory controller may determine positions of bits having the first logic value in the partial data, based on the position information included in the compressed data, and determine a data value of a bit group, based on the sampling data included in the compressed data. For example, the compressed data of 00010010 may represent that a data value of the fourth bit group is 01. Higher 6 bits of the compressed data may represent position information, and lower 2 bits of the compressed data may represent sampling data.

Figure 4:
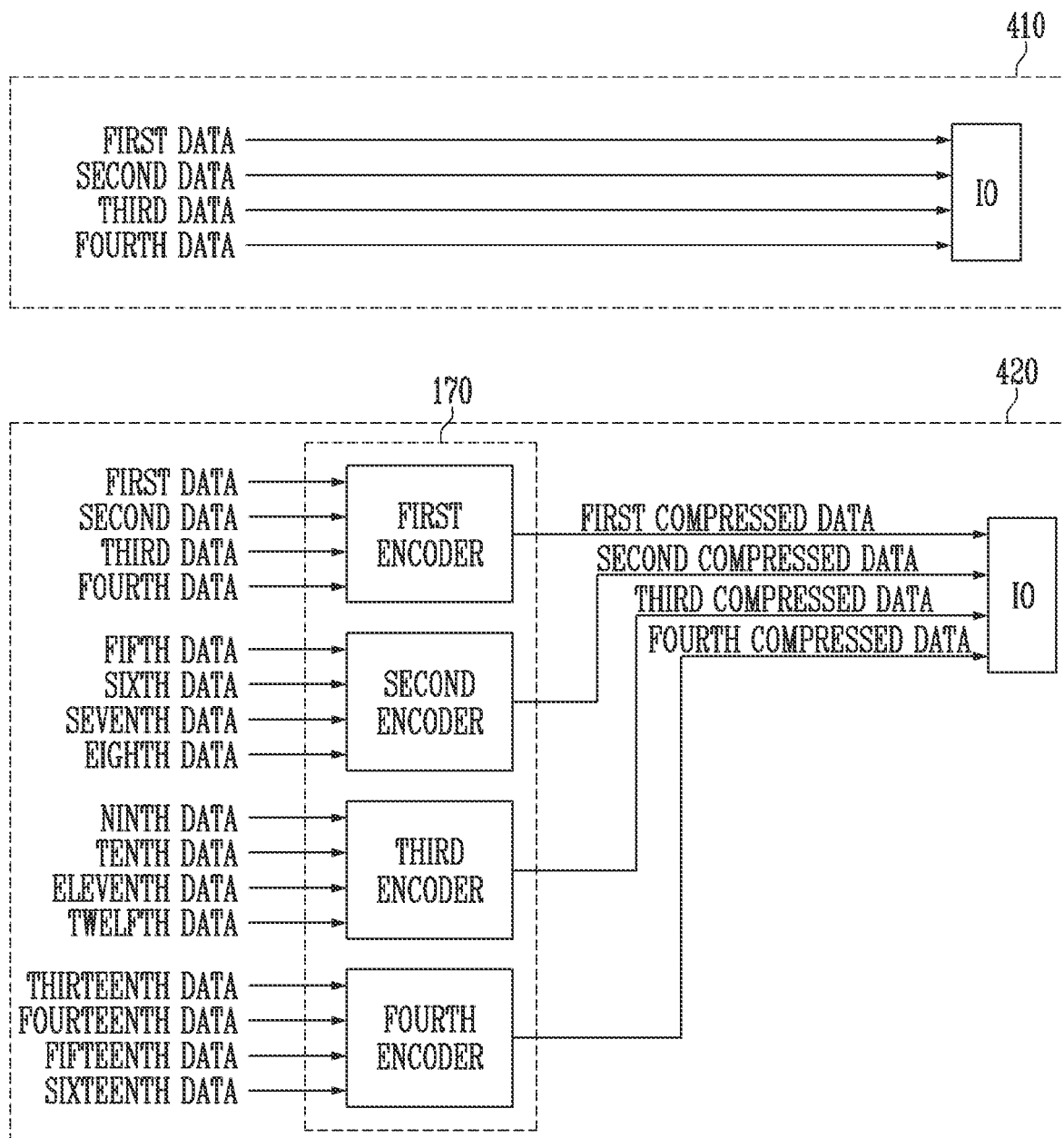
FIG. 4 is a diagram illustrating a method of transmitting compressed data in accordance with an embodiment of the present disclosure.

FIG. 4 is a diagram illustrating a method of transmitting compressed data in accordance with an embodiment of the present disclosure.

Referring to FIG. 4, a case 410 where uncompressed data is transmitted through the input/output channel and a case 420 where compressed data is transmitted through the input/output channel are illustrated. The encoding device may include a plurality of encoders. The plurality of encoders may correspond to a plurality of memory areas, respectively.

For example, in the case 410 where uncompressed data is transmitted, first to fourth data may be transmitted to the input/output channel IO. The first to fourth data may have the same size. The input/output channel IO included in the memory device may perform a processing operation on the received first to fourth data. The input/output channel IO may process a total of four data chunks.

In order to improve the performance of the input/output channel IO by compressing read data, original data is compressed, and data output is to be made by using only the compressed data. When compressed data and dummy data are output together, input/output performance might not be improved.

In an embodiment of the present disclosure, the encoding device 170 may include a first encoder, a second encoder, a third encoder, and a fourth encoder. Each encoder may receive four data chunks, and compress the four data chunks as one compressed data chunk. For example, the first encoder may generate first compressed data by compressing first to fourth data. The second encoder may generate second compressed data by compressing fifth to eighth data. The third encoder may generate third compressed data by compressing ninth to twelfth data. The fourth encoder may generate fourth compressed data by compressing thirteenth to sixteenth data.

The encoding device 170 may generate first to fourth compressed data and transmit the first to fourth compressed data to the input/output channel 10. The input/output channel 10 may perform a processing operation on the received first to fourth compressed data. The input/output channel 10 may output the received first to fourth compressed data according to a predetermined mapping order.

A size of compressed data may be equal to a size of data transmitted to the encoder. As for a data amount processed by the input/output channel IO, a case where uncompressed data is processed and a case where compressed data is processed may be the same. When data is compressed and transmitted, the amount of transmitted data can be increased while the data processing amount of the input/output channel IO is not changed.

In FIG. 4, the amount of compressed data generated in the plurality of encoders is increased, so that the input/output channel IO can output compressed data instead of dummy data. For example, the encoding device 170 may include four encoders, and each of the four encoders may generate compressed data compressed at 1:4. Therefore, a data amount may be output, which is four times greater than a data amount when read data is output without being compressed. Specifically, as compared with that first to fourth data are transmitted to the input/output channel IO in the case 410 uncompressed data is transmitted, first to sixteenth data may be transmitted to the input/output channel in the case 420 where compressed data is transmitted.

In an embodiment of the present disclosure, the encoding device 170 may include encoders respectively corresponding to a plurality of memory areas from which read data is read. A maximum compression ratio may be determined according to a number of a plurality of memory areas included in the memory device. For example, when the memory device includes 8 memory areas, the encoding device 170 may include 8 encoders, and a compression ratio of compressed data generated by the encoding device 170 may be 1:8.

Figure 5:
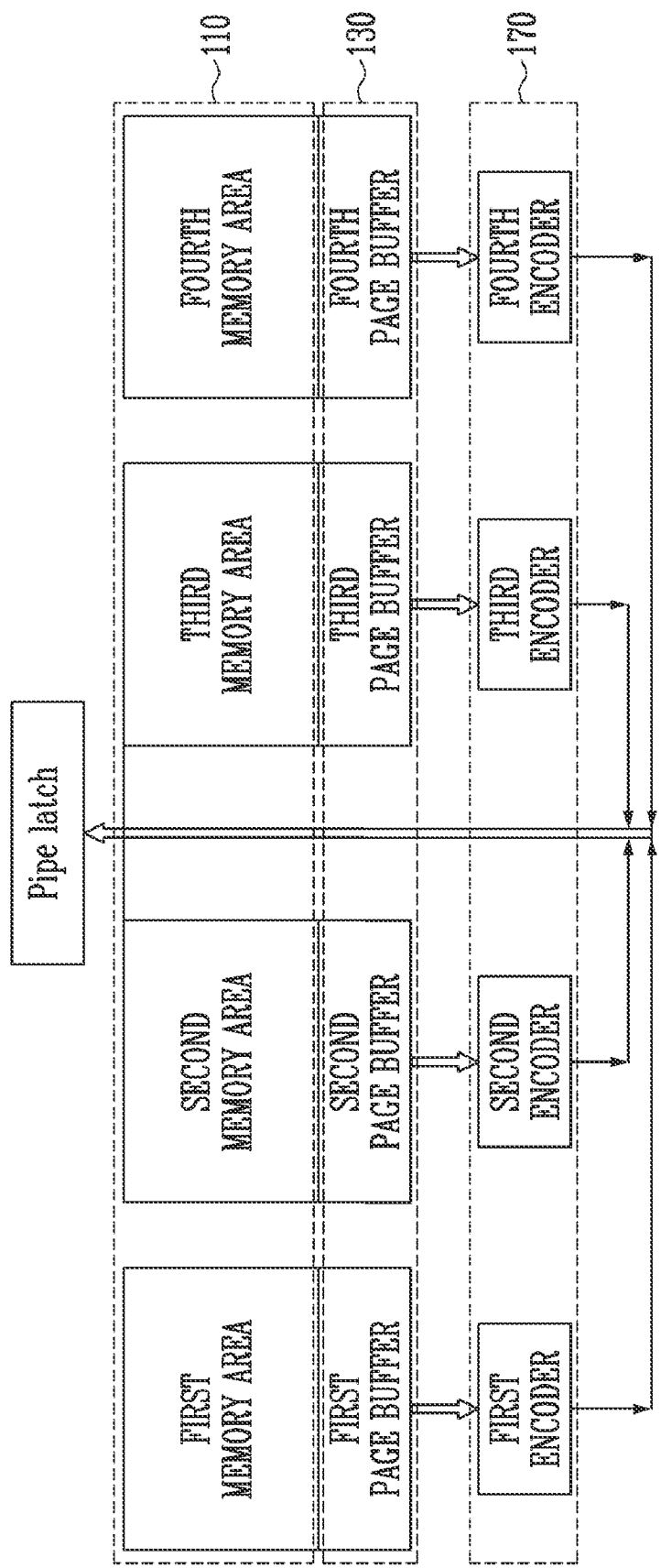
FIG. 5 is a diagram illustrating a method of compressing and transmitting a plurality of read data read from a plurality of memory areas in accordance with an embodiment of the present disclosure.

FIG. 5 is a diagram illustrating a method of compressing and transmitting a plurality of read data read from a plurality of memory areas in accordance with an embodiment of the present disclosure.

Referring to FIG. 5, original data read from four memory areas may be generated as compressed data through four encoders, respectively, and the compressed data may be transmitted to a pipe latch. In FIG. 5, the thickness of an arrow may represent an amount of data. For example, the thicker the arrow in FIG. 5, the greater amount of data being indicated as transmitted from one element to another element. An amount of data output from the respective memory areas is a total amount of data which can be output through a channel, and may be expressed as 100%.

When assuming that a compression ratio of the encoder is 1:4, an amount of compressed data output from the encoder may be expressed as 25%. Since an amount of 25% is output from each of the encoders, a total amount of compressed data transmitted to the pipe latch may become 100%.

In accordance with the embodiment of the present disclosure, the total amount of output original data can be increased without changing the total amount of data which can be output to the input/output channel. In an embodiment, since the total amount of output original data is increased, occurrence of a bottleneck phenomenon in the input/output channel can be prevented or mitigated.

In FIG. 5, read data may be respectively output from a first memory area, a second memory area, a third memory area, and a fourth memory area, which are included in a memory cell array 110. A page buffer group 130 may include a first page buffer, a second page buffer, a third page buffer, and a fourth page buffer. The first page buffer may transmit data output from the first memory area to a first encoder. The encoding device 170 may include the first encoder, a second encoder, a third encoder, and a fourth encoder. The first encoder may divide received read data into partial data and extract bits having the first logic value from the partial data, thereby generating a plurality of compressed data.

Similarly, read data output from the other memory areas may be transmitted to the encoder through the page buffers, respectively, and each of the encoders may generate a plurality of compressed data.

The plurality of generated compressed data may be stored in the pipe latch, and be output through the data output unit.

In an embodiment of the present disclosure, compressed data output from the encoding device 170 may be output according to a predetermined mapping order. For example, the compressed data may be output in an order from the first encoder to the fourth encoder. The pipe latch may store the compressed data in the received order. The compressed data stored in the pipe latch itself may represent information on a position of original data.

In another embodiment of the present disclosure, a portion of compressed data generated in the first encoder and a portion of compressed data generated in the second to fourth encoders may be transmitted, and the other compressed data may be transmitted to the pipe latch. Before data is transmitted/received, information on a mapping order in which compressed data are output may be transferred in advance.

The order of compressed data output from the encoders may vary according to the position of a memory area. The position of compressed data stored in the pipe latch may represent information on a physical address of original data. Each of the compressed data generated in the encoders may include information on an encoder compressing data or information on a memory area in which original data is stored.

Figure 6:
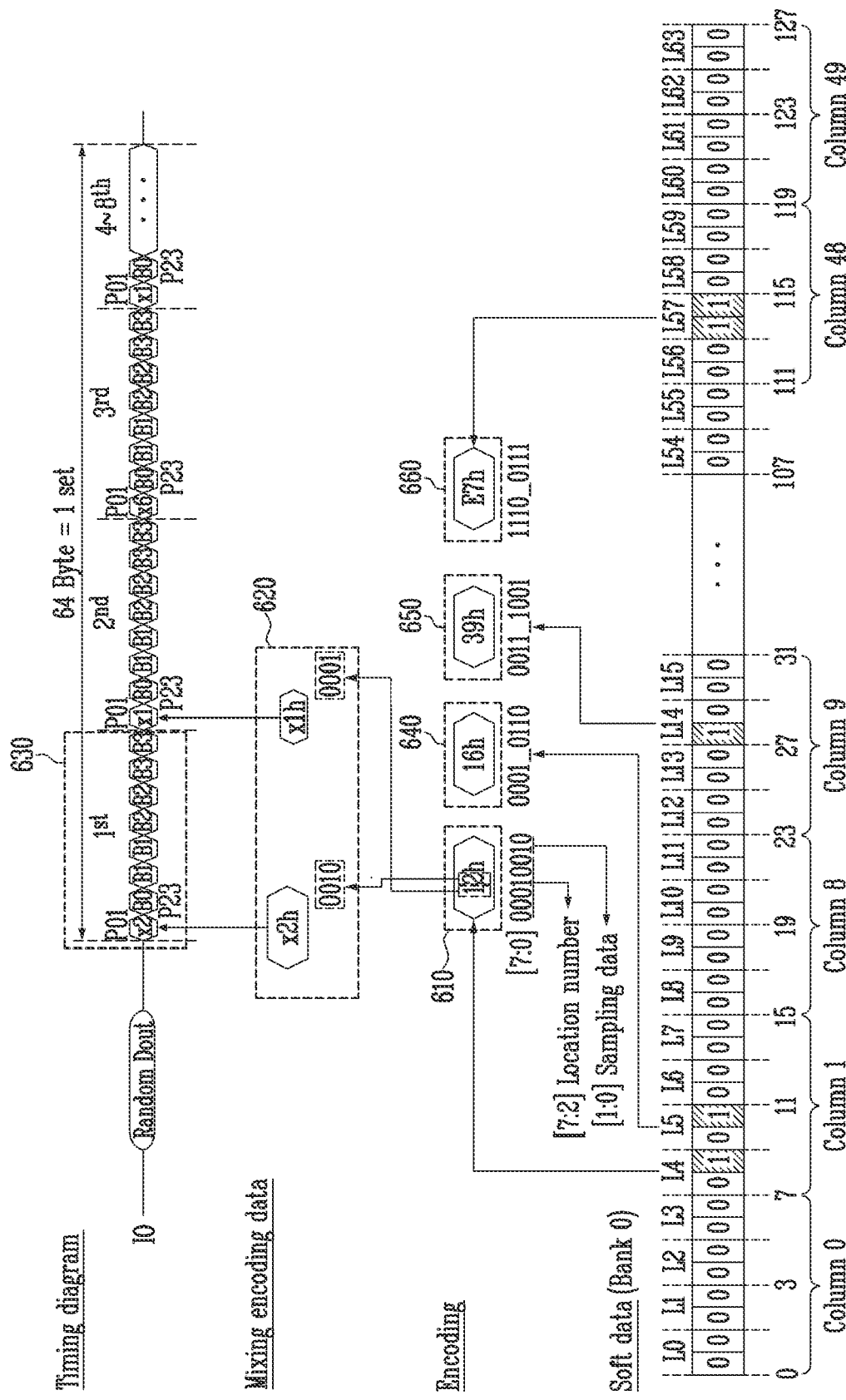
FIG. 6 is a diagram illustrating a method of mixing and transmitting encoded data in accordance with an embodiment of the present disclosure.

FIG. 6 is a diagram illustrating a method of mixing and transmitting encoded data in accordance with an embodiment of the present disclosure.

Referring to FIG. 6, compressed data obtained by encoding original data may be transmitted while being mixed other compressed data (Random Dout). A process of generating the compressed data may be identical to the process described with reference to FIGS. 2 and 3.

In an embodiment of the present disclosure, the compressed data may be divided to be transmitted through the input/output channel IO. For example, first compressed data 610 expressed as a binary number of 00010010 may be expressed as a hexadecimal number of 12. The first compressed data 610 may be divided into higher and lower bits 620 to be transmitted. Positions at which the higher and lower bits 620 of the first compressed data are transmitted may be predetermined. For example, the lower bit of the first compressed data 610 may be output at a zeroth position P01 of a first output group 1st 630. In this manner, the higher bit of the first compressed data 610 may be output at a zeroth position P01 of a second output group 2nd. Similarly, the higher and lower bits of the compressed data may be included in different output groups. As used herein, the tilde "~" indicates a range of components. For example, "4~8th" indicates the fourth, fifth, sixth, seventh, and eighth output groups shown in FIG. 6.

Although only the first compressed data 610 is illustrated in FIG. 6, second compressed data 640, third compressed data 650, and fourth compressed data 660 may be included in output groups, like the first compressed data 610. For example, a lower bit of the second compressed data 640 may be output at a first position P23 of the first output group 1st 630, and a higher bit of the second compressed data 640 may be output at a first position P23 of the second output group 2nd. The third compressed data 650 and the fourth compressed data 660 may also be divided into higher and lower bits to be included in output groups. Specifically, a lower bit of the third compressed data 650 and a lower bit of the fourth compressed data 660 may be output at zeroth and first positions P01 P23 of a third output group 3rd, and a higher bit of the third compressed data 650 and a higher bit of the fourth compressed data 660 may be output at zeroth and first positions P01 P23 of a fourth output group 4th.

An output group of the input/output channel IO may include a portion of compressed data corresponding to a plurality of memory areas according to a predetermined mapping order. For example, the first output group 1st 630 may include a portion of compressed data corresponding to a zeroth memory area at the zeroth and first positions P01 P23, and include a portion of the compressed data corresponding to a first memory area at second and third positions. The first output group 630 may include a portion of compressed data corresponding to a second memory area at fourth and fifth positions, and include a portion of the compressed data corresponding to a third memory area at sixth and seventh positions. Similarly, the other output groups may include portions of compressed data corresponding to the zeroth, first, second, and third memory areas at predetermined positions.

The method of mixing encoded data, which is shown in FIG. 6, is merely an embodiment, and the encoded data may be mixed by using various methods. The method of mixing encoded data may vary according to a number of memory areas, a data compression ratio, and a number of compressed data.

Figure 7:
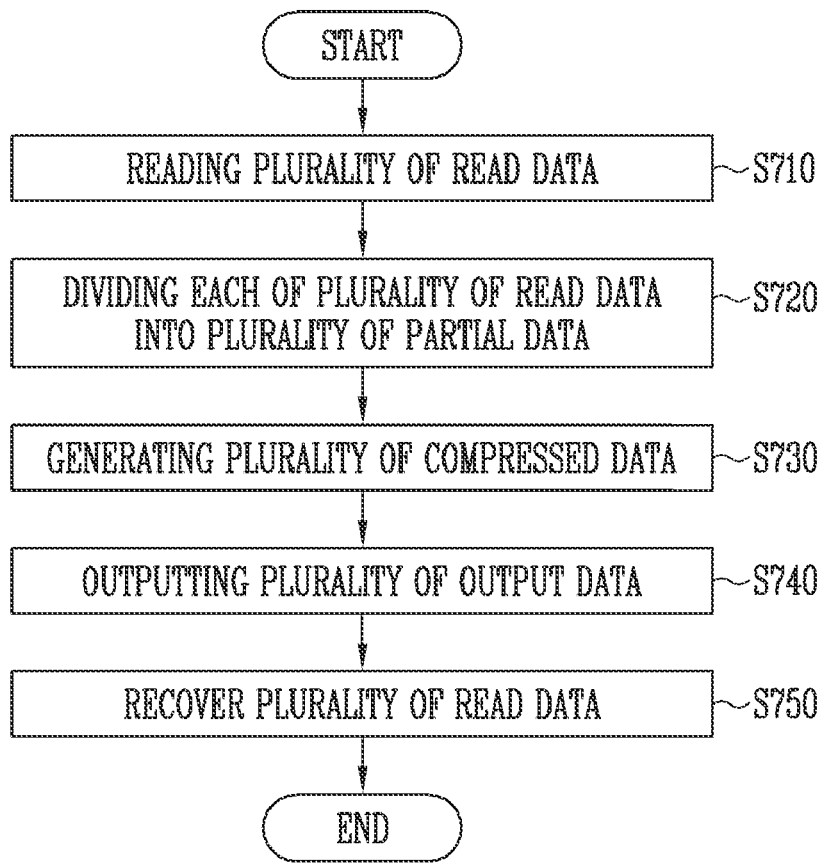
FIG. 7 is a flowchart illustrating an operating method of the storage device in accordance with an embodiment of the present disclosure.

FIG. 7 is a flowchart illustrating an operating method of the storage device in accordance with an embodiment of the present disclosure.

Referring to FIG. 7, the storage device may generate a plurality of compressed data corresponding to each of read data read from a plurality of memory areas, and receive a plurality of compressed data output in response to a data output command, thereby recovering the plurality of compressed data as original data. In an embodiment, since compressed data is transmitted through the input/output channel, transmission efficiency can be improved, and occurrence of a bottleneck phenomenon of the input/output channel can be prevented or mitigated.

In step S710, the data receiver may read a plurality of read data from a plurality of memory areas which transmit/receive data through one channel. A maximum compression ratio may be determined based on a number of a plurality of memory areas included in the memory device.

In step S720, the data compressor may divide each of the plurality of read data into a plurality of partial data. The data compressor may determine a size of the partial data, based on a size of compressed data to be generated. In another embodiment of the present disclosure, the data compressor may provide different sizes of the partial data according to the plurality of memory areas.

In step S730, the data compressor may generate a plurality of compressed data, based on the partial data. The data compressor may extract bits having a first logic value among bits included in each of the plurality of partial data. The data compressor may generate a plurality of compressed data including the bits having the first logic value and position information representing positions of the bits having the first logic value.

In step S740, the data output unit may output a plurality of compressed data in response to a data output command. The data output command may be received from an external host. The data output unit may simultaneously output the plurality of compressed data through one channel. In an embodiment of the present disclosure, the data output unit may output the plurality of compressed data according to a mapping order associated with the plurality of memory areas in one output cycle. The word "simultaneously" as used herein with respect to processes mean that the processes take place on overlapping intervals of time. For example, if a first process takes place over a first interval of time and a second process takes place simultaneously over a second interval of time, then the first and second intervals of time at least partially overlap each other such that there exists a time at which the first and second processes are both taking place.

In step S750, the memory controller may recover the plurality of read data, based on the plurality of received compressed data. The memory controller may recover original data, based on the order in which the plurality of compressed data are output, the bits having the first logic value, which are included in the plurality of compressed data, and the position information.

The memory controller may sort compressed data, based on a predetermined mapping order. The memory controller may determine an order of a plurality of partial data recovered by a plurality of compressed data, based on an order in which the plurality of compressed data are output. The memory controller may connect the recovered partial data according to the determined order, thereby recovering the read data.

The operating method of the storage device may correspond to descriptions shown in FIGS. 1 to 6.

Figure 8:
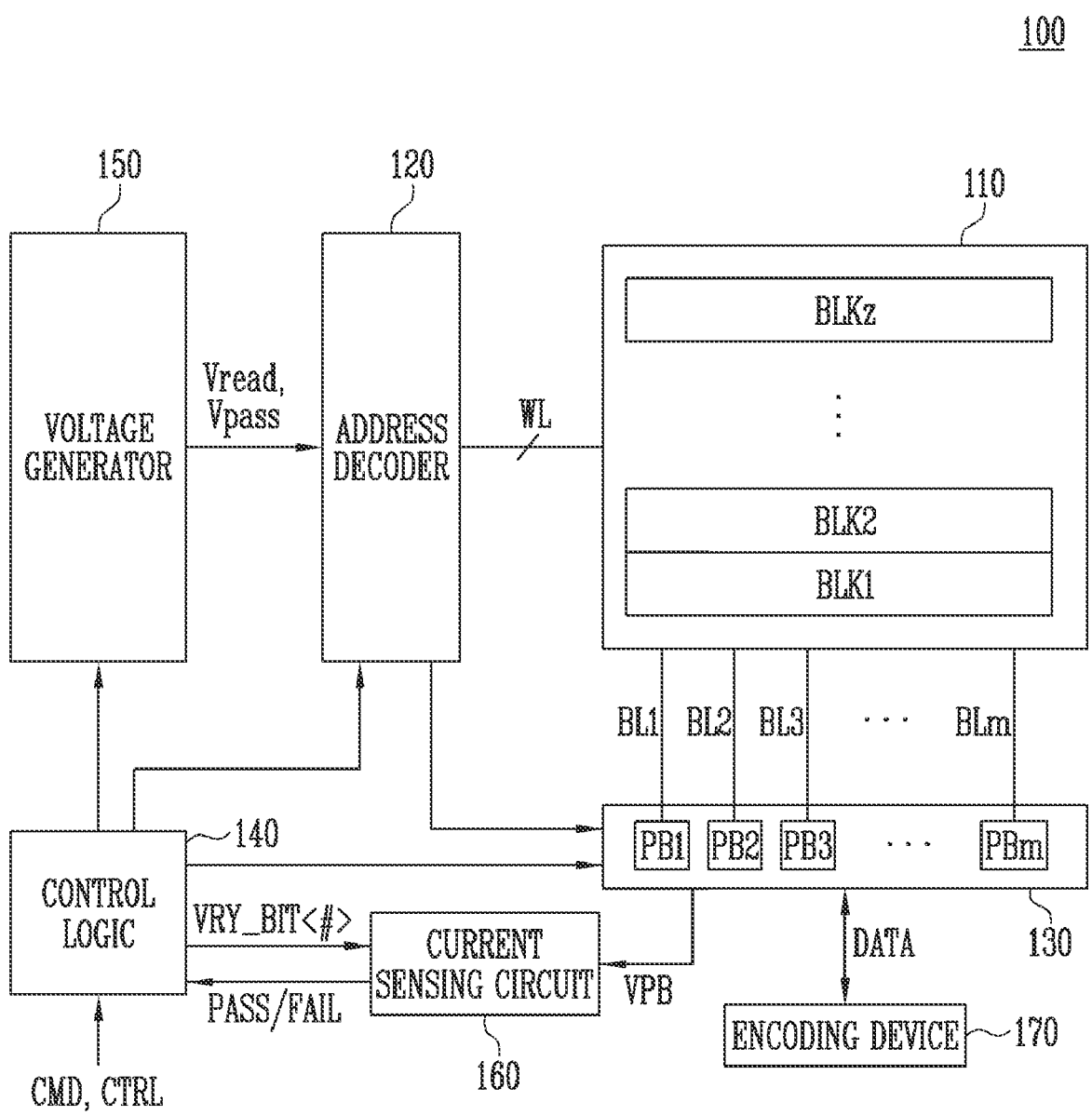
FIG. 8 is a diagram illustrating the memory device shown in FIG. 1.

FIG. 8 is a diagram illustrating the memory device shown in FIG. 1.

Referring to FIG. 8, the memory device 100 may include a memory cell array 110, an address decoder 120, a page buffer group 130, control logic 140, a voltage generator 150, a current sensing circuit 160, and an encoding device 170. The address decoder 120, the page buffer group 130, the voltage generator 150, and the current sensing circuit 160 may be referred to as a peripheral circuit controlled by the control logic 140. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the page buffer group 130 through bit lines BL1 to BLm. Each of the plurality of memory blocks BLK1 to BLKz may include a plurality of memory cells. In an embodiment, the plurality of memory cells may be nonvolatile memory cells, and be configured with nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120 may be connected to the memory cell array 110 through the word lines WL. The address decoder 120 may operate under the control of the control logic 140. The address decoder 120 may receive an address through an input/output channel in the memory device 100.

The address decoder 120 may decode a block address in the received address. The address decoder 120 may select at least one memory block according to the decoded block address. Also, in a read voltage application operation during a read operation, the address decoder 120 may apply a read voltage Vread generated by the voltage generator 150 to a selected word line of the selected memory block, and apply a pass voltage Vpass to the other unselected word lines. Also, in a program verify operation, the address decoder 120 may apply a verify voltage generated by the voltage generator 150 to the selected word line of the selected memory block, and apply the pass voltage Vpass to the other unselected word lines.

The address decoder 120 may decode a column address in the received address. The address decoder 120 may transmit the decoded column address to the page buffer group 130.

A read operation and a program operation of the memory device 100 may be performed in units of pages. An address received in a request for the read operation and the program operation may include a block address, a row address, and a column address. The address decoder 120 may select one memory block and one word line according to the block address and the row address. The column address may be decoded by the address decoder 120 to be provided to the page buffer group 130. In this specification, memory cells connected to one word line may be designated as a "physical page."

The page buffer group 130 may include a plurality of page buffers PB1 to PBm. The page buffer group 130 may operate as a "read circuit" in a read operation, and operate as a "write circuit" in a write operation. The plurality of page buffers PB1 to PBm may be connected to the memory cell array 110 through the bit lines BL1 to BLm. In order to sense a threshold voltage of memory cells in a read operation and a program verify operation, the plurality of page buffers PB1 to PBm may sense, through a sensing node, a change in amount of flowing current according to a program state of a corresponding memory cell while continuously supplying a sensing current to bit lines connected to the memory cells, and latch the change in amount of current as sensing data. The page buffer group 130 operates in response to page buffer control signals output from the control logic 140. In this specification, the write operation of the write circuit may be used as the same meaning as a program operation on selected memory cells.

In a read operation, the page buffer group 130 may temporarily store read data by sensing data of a memory cell and then output data DATA to the encoding device 170 of the memory device 100.

The encoding device 170 may compress the read data before outputting data through the input/output channel. The compressed read data may be output through the input/output channel.

The control logic 140 may be connected to the address decoder 120, the page buffer group 130, the voltage generator 150, and the current sensing circuit 160. The control logic 140 may receive a command CMD and a control signal CTRL though the input/output channel of the memory device 100. The control logic 140 may control a general operation of the memory device 100 in response to the control signal CTRL. Also, the control logic 140 may output a control signal for adjusting a sensing node precharge potential level of the plurality of page buffers PB1 to PBm. The control logic 140 may control the page buffer group 130 to perform a read operation of the memory cell array 110.

Meanwhile, the control logic 140 may determine whether a verify operation on a specific target program state has passed or failed in response to a pass signal PASS or a fail signal FAIL, which is received from the current sensing circuit 160.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage. The voltage generator 150 may generate the plurality of voltages by selectively activating the plurality of pumping capacitors under the control of the control logic 140.

The sensing circuit 160 may generate a reference current and a reference voltage in response to an allow bit VRY_BIT<#> received from the control logic 140 in a verify operation. The sensing circuit 160 may output the pass signal PASS or the fail signal FAIL by comparing the generated reference voltage with a sensing voltage VPB received from the page buffers PB1 to PBm included in the page buffer group 130 or by comparing the generated reference current with a sensing current received from the page buffers PB1 to PBm included in the page buffer group 130.

The address decoder 120, the page buffer group 130, the voltage generator 150, and the current sensing circuit 160 may serve as a "peripheral circuit" for performing a read operation, a write operation, and an erase operation on the memory cell array 110. The peripheral circuit may perform the read operation, the write operation, and the erase operation on the memory cell array 110 under the control of the control logic 140.

Figure 9:
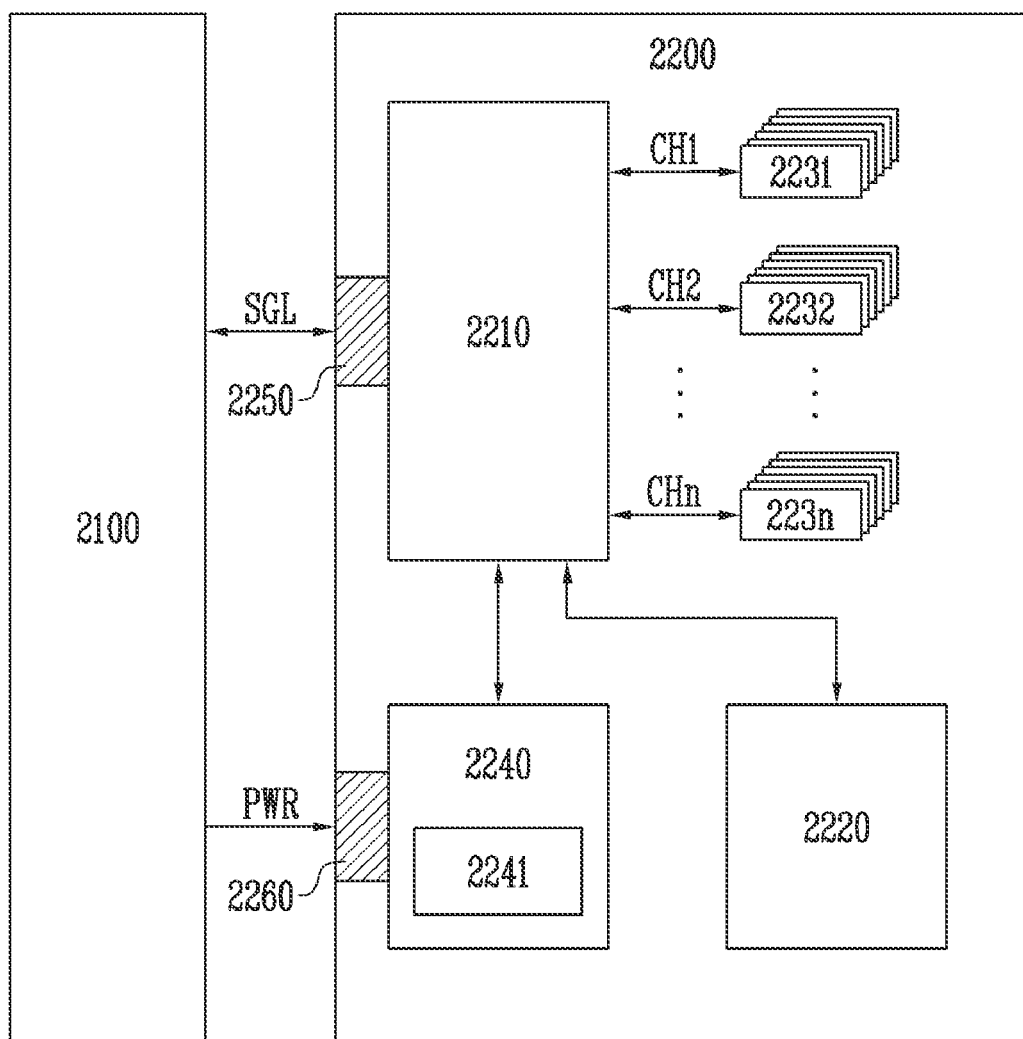
FIG. 9 is a diagram illustrating a data processing system including a solid state drive in accordance with an embodiment of the present disclosure.

FIG. 9 is a diagram illustrating, for example, a data processing system including a solid state drive in accordance with an embodiment of the present disclosure.

Referring to FIG. 9, the data processing system 2000 includes a host device 2100 and an SSD 2200.

The SSD 2200 may include a controller 2210, a buffer memory device 2220, nonvolatile memories 2231 to 223n, a power supply 2240, a signal connector 2250, and a power connector 2260.

The controller 2210 may control overall operations of the SSD 2200.

The buffer memory device 2220 may temporarily store data to be stored in the nonvolatile memories 2231 to 223n. Also, the buffer memory device 2220 may temporarily store data read from the nonvolatile memories 2231 to 223n. The data temporarily stored in the buffer memory device 2220 may be transmitted to the host device 2100 or the nonvolatile memories 2231 to 223n under the control of the controller 2210.

The nonvolatile memories 2231 to 223n may be used as a storage medium of the SSD 2200. Each of the nonvolatile memories 2231 to 223n may be connected to the controller 2210 through a plurality of channels CH1 to CHn. One or more nonvolatile memories may be connected to one channel. Nonvolatile memories connected to one channel may be connected to the same signal bus and the same data bus.

In an embodiment of the present disclosure, the nonvolatile memories 2231 to 223n may generate a plurality of compressed data obtained by encoding and compressing read data. The plurality of generated compressed data may be stored in the buffer memory device 2220 to be output.

The power supply 2240 may provide power PWR input through the power connector 2260 to the inside of the SSD 2200. The power supply 2240 may include an auxiliary power supply 2241. The auxiliary power supply 2241 may supply power such that the SSD 2200 can be normally ended, when sudden power off occurs. The auxiliary power supply 2241 may include large-capacity capacitors capable of charging the power PWR.

The controller 2210 may exchange a signal SGL with the host device 2100 through the signal connector 2250. The signal SGL may include a command, an address, data, and the like. The signal connector 2250 may be configured as various types of connectors according to an interface method between the host device 2100 and the SSD 2200.

Figure 10:
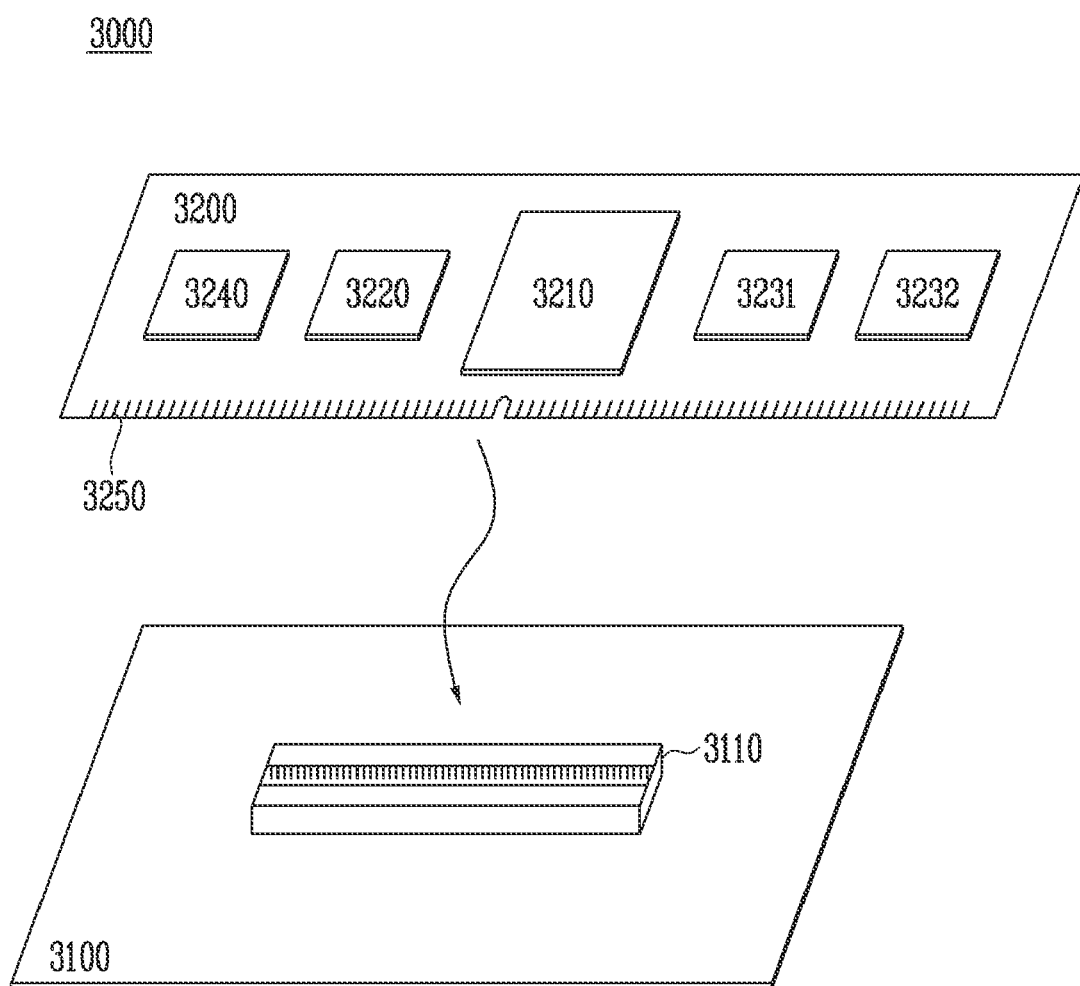
FIG. 10 is a diagram illustrating a data processing system including a data storage device in accordance with an embodiment of the present disclosure.

FIG. 10 is a diagram illustrating, for example, a data processing system including a data storage device in accordance with an embodiment of the present disclosure.

Referring to FIG. 10, the data processing system 3000 may include a host device 3100 and a data storage device 3200.

The host device 3100 may be configured in the form of a board such as a printed circuit board. Although not shown in the drawing, the host device 3100 may include internal function blocks for performing the function of the host device.

The host device 3100 may include a connection terminal 3110 such as a socket, a slot or a connector. The data storage device 3200 may be mounted on or in the connection terminal 3110.

The data storage device 3200 may be configured in the form of a board such as a printed circuit board. The data storage device 3200 may be referred to as a memory module or a memory card. The data storage device 3200 may include a controller 3210, a buffer memory device 3220, nonvolatile memories 3231 and 3232, a Power Management Integrated Circuit (PMIC) 3240 and a connection terminal 3250.

In an embodiment of the present disclosure, the data storage device 3200 may generate partial data by dividing data read from the nonvolatile memories 3231 and 3232, and generate a plurality of compressed data including position information representing bits having a first logic value among bits included in the partial data and sampling data and then store the plurality of generated compressed data in the buffer memory device 3220. In an embodiment, compressed data is transmitted, so that a data bottleneck phenomenon occurring in the data storage device 3200 can be prevented or mitigated.

The controller 3210 may control overall operations of the data storage device 3200. The controller 3210 may be configured identically to the controller 2210 shown in FIG. 9.

The buffer memory device 3220 may temporarily store data to be stored in the nonvolatile memories 3231 and 3232. The buffer memory device 3220 may temporarily store data read from the nonvolatile memories 3231 and 3232. The data temporarily stored in the buffer memory device 3220 may be transmitted to the host device 3100 or the nonvolatile memories 3231 and 3232 under the control of the controller 3210.

The nonvolatile memories 3231 and 3232 may be used as storage media of the data storage device 3200.

The PMIC 3240 may provide power inputted through the connection terminal 3250 to the inside of the data storage device 3200. The PMIC 3240 may manage power of the data storage device 3200 under the control of the controller 3210.

The connection terminal 3250 may be connected to the connection terminal 3110 of the host device 3100. Through the connection terminal 3250, power and signals such as commands, addresses and data may be transferred between the host device 3100 and the data storage device 3200. The connection terminal 3250 may be configured in various forms according to an interface method between the host device 3100 and the data storage device 3200. The connection terminal 3250 may be disposed on any one side of the data storage device 3200.

In accordance with the present disclosure, in an embodiment, there can be provided a storage device and an operating method thereof, in which an amount of input/output data is decreased by compressing read data, so that a larger amount of data can be transmitted for a short period of time.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device comprising:
a memory device configured to extract first bits having a first logic value among bits included in data, generate a plurality of compressed data chunks including second bits representing the first logic value and position information representing positions of the first bits having the first logic value in the data, and output the plurality of compressed data chunks in response to a data output command; and
a memory controller configured to receive the plurality of compressed data chunks from the memory device, and recover the data, based on the second bits and the position information, which are included in the plurality of compressed data chunks,
wherein each of the plurality of compressed data chunks includes third bits representing the position information and the second bits representing the first logic value, and
wherein the memory device determines a number of the third bits representing the position information and a number of the second bits representing the first logic value based on a number of the first bits having the first logic value in the data.

2. The storage device of claim 1,
wherein the data is read data read from selected memory cells, and
wherein the memory device divides the read data into a plurality of partial data chunks, generates the plurality of compressed data chunks in each of the plurality of partial data chunks, and outputs the plurality of compressed data chunks generated in each of the plurality of partial data chunks according to an order in which the plurality of partial data chunks are located in the read data.

3. The storage device of claim 2,
wherein the memory device determines a size of each of the plurality of partial data chunks, based on a size of the plurality of compressed data chunks.

4. The storage device of claim 2,
wherein the memory device determines a number of the plurality of compressed data chunks allocated to each of the plurality of partial data chunks, based on a predetermined compression ratio, and generates compressed data chunks corresponding to the number.

5. The storage device of claim 2,
wherein the memory controller determines an order of the plurality of partial data chunks recovered by the plurality of compressed data chunks, based on an order in which the plurality of compressed data chunks are output, and recovers the read data according to the order.

6. The storage device of claim 5,
wherein the memory controller recovers the plurality of partial data chunks including the first bits having the first logic value at a position determined based on the position information, and
wherein the read data is recovered by arranging the plurality of recovered partial data chunks according to the order.

7. An encoding device configured to extract first bits having a first logic value among bits included in read data read from a storage device, divide the read data into a plurality of partial data chunks and generate a plurality of compressed data chunks including position information representing positions of bit groups including the first bits having the first logic value in each of the plurality of partial data chunks and second bits representing the bit groups,
wherein the encoding device determines a number of third bits representing the position information and a number of the second bits representing the bit groups based on a number of the first bits having the first logic value in the read data.

8. The encoding device of claim 7,
wherein the encoding device samples each of the plurality of partial data chunks in a unit of at least two bits, and detects the bit groups from each of the plurality of partial data chunks.

9. The encoding device of claim 8,
wherein each of the plurality of compressed data chunks includes the position information representing the positions of the bit groups in each of the plurality of partial data chunks and sampling data of the bit groups.

10. The encoding device of claim 9,
wherein the encoding device determines a size of each of the plurality of partial data chunks as $M*(2^N)$ bits,
wherein the position information is expressed with N bits, and
wherein the sampling data is expressed with M bits.

11. The encoding device of claim 7,
wherein the encoding device receives a plurality of read data chunks from a plurality of memory areas, determines a compression ratio, based on a number of the plurality of memory areas, and generates the plurality of compressed data chunks from each of the plurality of read data chunks, based on the compression ratio.

12. The encoding device of claim 11, comprising a plurality of encoders respectively corresponding to the plurality of memory areas,
wherein the encoders simultaneously transmit the plurality of compressed data chunks to a data output unit of a memory device.

13. A method of operating a storage device, the method comprising:
receiving a plurality of data chunks from a plurality of memory areas which transmit and/or receive data through one channel;
dividing each of the plurality of data chunks into a plurality of partial data chunks;
extracting first bits having a first logic value among bits included in each of the plurality of partial data chunks, and generating a plurality of compressed data chunks including second bits representing the first logic value and position information representing positions of the first bits having the first logic value in the plurality of partial data chunks;
outputting the plurality of compressed data chunks in response to a data output command; and recovering the plurality of data chunks, based on an order in which the plurality of compressed data chunks are output, and the second bits and the position information, which are included in the plurality of compressed data chunks, wherein a number of third bits representing the position information and a number of the second bits representing the first logic value in each of the plurality of partial data chunks are determined based on a number of the first bits having the first logic value in the plurality of data chunks.

14. The method of claim 13, wherein the outputting of the plurality of compressed data chunks includes outputting the plurality of compressed data chunks according to an order in which the plurality of partial data chunks are located in each of the plurality of data chunks.

15. The method of claim 14, wherein the dividing of each of the plurality of data chunks into the plurality of partial data chunks further includes determining a size of each of the plurality of partial data chunks, based on a size of the plurality of compressed data chunks, and wherein each of the plurality of compressed data chunks includes the third bits representing the position information and the second bits representing the first logic value.

16. The method of claim 14, wherein the generating of the plurality of compressed data chunks includes determining a number of the plurality of compressed data chunks allocated to each of the plurality of partial data chunks, based on a predetermined compression ratio.

17. The method of claim 14, wherein the recovering of the plurality of data chunks includes:

recovering the plurality of partial data chunks including the first bits having the first logic value at a position determined based on the position information;

determining an order of the plurality of recovered partial data chunks, based on the order in which the plurality of compressed data chunks are output; and connecting the plurality of recovered partial data chunks according to the determined order.

\* \* \* \* \*